United States Patent
Kwon et al.

(10) Patent No.: US 8,564,197 B2
(45) Date of Patent: Oct. 22, 2013

(54) FLAT PANEL DISPLAY APPARATUS AND METHOD FOR MANUFACTURING THE SAME

(75) Inventors: Oh-Seob Kwon, Yongin (KR); Sung-Soo Koh, Yongin (KR); Dong-Seop Park, Yongin (KR); Jae-Sang Ro, Seoul (KR); Seog-Young Lee, Seoul (KR); Won-Eui Hong, Seoul (KR)

(73) Assignees: Samsung Display Co., Ltd., Giheung-Gu, Yongin, Gyeonggi-Do (KR); Ensil Tech Co., Ltd., Gasan-Dong, Geumcheon-Gu, Seoul (KR)

( * ) Notice: Subject to any disclaimer, the term of this patent is extended or adjusted under 35 U.S.C. 154(b) by 204 days.

(21) Appl. No.: 13/236,854

(22) Filed: Sep. 20, 2011

(65) Prior Publication Data

US 2012/0106044 A1    May 3, 2012

(30) Foreign Application Priority Data

Oct. 27, 2010  (KR) .................. 10-2010-0105376

(51) Int. Cl.
*H01L 51/00*      (2006.01)
*H05B 33/04*      (2006.01)

(52) U.S. Cl.
USPC ............................................ 313/512; 445/25

(58) Field of Classification Search
USPC ............ 313/512, 504, 506; 219/50, 162, 209; 445/25
See application file for complete search history.

(56) References Cited

U.S. PATENT DOCUMENTS

| 7,019,718 | B2 * | 3/2006 | Yamazaki et al. ............... 345/80 |
| 8,067,883 | B2 * | 11/2011 | Wang ............................ 313/292 |
| 2009/0128015 | A1 * | 5/2009 | Kim et al. ..................... 313/504 |
| 2009/0218320 | A1 | 9/2009 | Wang |
| 2009/0218932 | A1 | 9/2009 | Wang |

FOREIGN PATENT DOCUMENTS

| JP | 2000-252058 | 9/2000 |
| KR | 10-2001-0039300 | 5/2001 |
| KR | 10-2001-0109011 | 12/2001 |
| KR | 10-2001-0111846 | 12/2001 |
| KR | 10-2003-0080895 | 10/2003 |
| KR | 10-2006-0028212 | 3/2006 |
| KR | 10-2006-0079615 | 7/2006 |

\* cited by examiner

*Primary Examiner* — Karabi Guharay
(74) *Attorney, Agent, or Firm* — Robert E. Bushnell, Esq.

(57) ABSTRACT

In a flat panel display apparatus and a method of manufacturing the same, the flat panel display apparatus includes a substrate, a display unit disposed on the substrate, a sealing substrate disposed facing the display unit, a sealing member disposed between the substrate and the sealing substrate so as to surround the display unit, a wiring unit disposed between the substrate and the sealing substrate so as to partially overlap the sealing member, and at least three inlet portion groups to which voltage is applied via an external power source. The inlet portion groups are connected to the wiring unit. Each inlet portion group includes a plurality of sub-inlet portions.

20 Claims, 11 Drawing Sheets

FLAT PANEL DISPLAY APPARATUS AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Oct. 27, 2010 and there duly assigned Serial No. 10-2010-0105376.

BACKGROUND OF THE INVENTION

1. Field of the Invention

The present invention relates to a flat panel display apparatus and a method of manufacturing the same, and more particularly, to a flat panel display apparatus having improved encapsulating characteristics and a method of manufacturing the same.

2. Description of the Related Art

Recently, display apparatuses have been replaced by portable thin flat panel display apparatuses. In particular, flat panel display apparatuses, such as organic light-emitting display apparatuses and liquid crystal display apparatuses, have drawn attention for their good image quality.

In a flat panel display apparatus, a display unit is disposed on a substrate, and a sealing substrate is disposed on the display unit to protect the display unit. A sealing member is disposed between the substrate and the sealing substrate to seal the flat panel display apparatus.

During the manufacture of the flat panel display apparatus, an encapsulating process is performed to protect the display unit from external moisture, any gaseous solutions, or other foreign substances. The performance of the flat panel display apparatus is determined greatly by encapsulating characteristics of the flat panel display apparatus.

The encapsulating characteristics of the flat panel display apparatus are determined by, for example, the performances of the sealing substrate and the sealing member, and particularly, by uniform characteristics of the sealing member.

However, it is not easy to manufacture such a sealing member, and thus, improving the encapsulating characteristics of the flat panel display apparatus is limited.

SUMMARY OF THE INVENTION

The present invention provides a flat panel display apparatus having improved encapsulating characteristics and a method of manufacturing the same.

According to an aspect of the present invention, a flat panel display apparatus includes: a substrate; a display unit disposed on the substrate; a sealing substrate disposed facing the display unit; a sealing member disposed between the substrate and the sealing substrate to surround the display unit; a wiring unit disposed between the substrate and the sealing substrate to partially overlap the sealing member; and at least three inlet portion groups to which voltage is applied via an external power source, the inlet portion groups being connected to the wiring unit. Each of the inlet portion groups includes a plurality of sub-inlet portions.

The plurality of sub-inlet portions of each of the inlet portion groups may be disposed apart from one another.

Each of the inlet portion groups may include two sub-inlet portions disposed apart from each other.

The width of each sub-inlet portion may be greater than a width of the wiring unit.

The inlet portion groups may include a first inlet portion group, a second inlet portion group, and a third inlet portion group which are sequentially disposed apart from one another. Each of the first inlet portion group, the second inlet portion group, and the third inlet portion group may include two sub-inlet portions disposed apart from each other.

The inlet portion groups may include a first inlet portion group, a second inlet portion group, a third inlet portion group, and a fourth inlet portion group which are sequentially disposed apart from one another. Each of the first inlet portion group, the second inlet portion group, the third inlet portion group, and the fourth inlet portion group may include two sub-inlet portions disposed apart from each other.

The inlet portion groups may include a first inlet portion group, a second inlet portion group, a third inlet portion group, a fourth inlet portion group, a fifth inlet portion group, and a sixth inlet portion group. Each of the first inlet portion group, the second inlet portion group, the third inlet portion group, the fourth inlet portion group, the fifth inlet portion group, and the sixth inlet portion group may include two sub-inlet portions disposed apart from each other.

The wiring unit may include a plurality of wiring members.

The plurality of wiring members may be disposed apart from one another on at least one region of the sealing member which overlaps the wiring unit.

The plurality of wiring members may be disposed on the substrate, and the sealing member may be disposed on the plurality of wiring members and in regions where adjacent wiring members are disposed apart from one another.

The sealing member may include frit.

The display unit may include an organic light-emitting device or a liquid crystal display device.

According to another aspect of the present invention, a method of manufacturing a flat panel display apparatus includes the steps of: preparing a substrate on which a display unit is disposed; disposing the sealing substrate to face the display unit; forming a sealing member between the substrate and the sealing substrate so as to surround the display unit; forming a wiring unit between the substrate and the sealing substrate, the wiring unit having a region which overlaps the sealing member; and forming at least three inlet portion groups to be electrically connected to an external power source. Each of the inlet portion groups may include a plurality of sub-inlet portions connected to the wiring unit. The forming of the sealing member may include preparing a material of the sealing member between the substrate and the sealing substrate; sequentially selecting each pair of adjacent inlet portion groups from among at least three inlet portion groups, and sequentially applying voltage to the wiring unit by connecting the selected pair of inlet portion groups to the external power source so that the material of the sealing member is fused and hardened by heat generated in the wiring unit as a result of the voltage applied via the selected inlet portion groups.

The forming of the sealing member may include sequentially selecting each pair of adjacent inlet portion groups from among at least three inlet portion groups, wherein the selected pair of inlet portion groups may include a first inlet portion group and a second inlet portion group; and applying voltage to the wiring unit by connecting one of the sub-inlet portions, except for a sub-inlet portion closest to the second inlet portion, from among sub-inlet portions of the first inlet portion group, and one of the sub-inlet portions, except for a sub-inlet portion closest to the first inlet portion, from among sub-inlet portions of the second inlet portion group, to the external power source.

The inlet portion groups may include a first inlet portion group, a second inlet portion group, and a third inlet portion group which are sequentially disposed apart from one another. The first inlet portion group may include a first sub-inlet portion A adjacent to the third inlet portion group, and a first sub-inlet portion B disposed apart from the first sub-inlet portion A and adjacent to the second inlet portion group. The second inlet portion group may include a second sub-inlet portion A adjacent to the first inlet portion group, and a second sub-inlet portion B disposed apart from the second sub-inlet portion A and adjacent to the third inlet portion group. The third inlet portion group may include a third sub-inlet portion A adjacent to the second inlet portion group, and a third sub-inlet portion B disposed apart from the third sub-inlet portion A and adjacent to the first inlet portion group. The forming of the sealing member may include: applying voltage to the wiring unit by connecting the first sub-inlet portion A and the second sub-inlet portion B to an external power source; applying voltage to the wiring unit by connecting the second sub-inlet portion A and the third sub-inlet portion B to the external power source; and applying voltage to the wiring unit by connecting the third sub-inlet portion A and the first sub-inlet portion B to the external power source.

The inlet portion groups may include a first inlet portion group, a second inlet portion group, a third inlet portion group, and a fourth inlet portion group which are sequentially disposed apart from one another. The first inlet portion group may include a first sub-inlet portion A adjacent to the fourth inlet portion group, and a first sub-inlet portion B disposed apart from the first sub-inlet portion A and adjacent to the second inlet portion group. The second inlet portion group may include a second sub-inlet portion A adjacent to the first inlet portion group, and a second sub-inlet portion B disposed apart from the second sub-inlet portion A and adjacent to the third inlet portion group. The third inlet portion group may include a third sub-inlet portion A adjacent to the second inlet portion group, and a third sub-inlet portion B disposed apart from the third sub-inlet portion A and adjacent to the fourth inlet portion group. The fourth inlet portion group may include a fourth sub-inlet portion A adjacent to the third inlet portion group, and a fourth sub-inlet portion B disposed apart from the fourth sub-inlet portion A and adjacent to the first inlet portion group. The forming of the sealing member may include: applying voltage to the wiring unit by connecting the first sub-inlet portion A and the second sub-inlet portion B to an external power source; applying voltage to the wiring unit by connecting the second sub-inlet portion A and the third sub-inlet portion B to the external power source; applying voltage to the wiring unit by connecting the third sub-inlet portion A and the fourth sub-inlet portion B to the external power source; and applying voltage to the wiring unit by connecting the fourth sub-inlet portion A and the first sub-inlet portion B to the external power source.

The inlet portion groups may include a first inlet portion group, a second inlet portion group, a third inlet portion group, a fourth inlet portion group, a fifth inlet portion group, and a sixth inlet portion group which are sequentially disposed apart from one another. The first inlet portion group may include a first sub-inlet portion A adjacent to the sixth inlet portion group, and a first sub-inlet portion B disposed apart from the first sub-inlet portion A and adjacent to the second inlet portion group. The second inlet portion group may include a second sub-inlet portion A adjacent to the first inlet portion group, and a second sub-inlet portion B disposed apart from the second sub-inlet portion A and adjacent to the third inlet portion group. The third inlet portion group may include a third sub-inlet portion A adjacent to the second inlet portion group, and a third sub-inlet portion B disposed apart from the third sub-inlet portion A and adjacent to the fourth inlet portion group, The fourth inlet portion group may include a fourth sub-inlet portion A adjacent to the third inlet portion group, and a fourth sub-inlet portion B disposed apart from the fourth sub-inlet portion A and adjacent to the fifth inlet portion group. The fifth inlet portion group may include a fifth sub-inlet portion A adjacent to the fourth inlet portion group, and a fifth sub-inlet portion B disposed apart from the fifth sub-inlet portion A and adjacent to the sixth inlet portion group. The sixth inlet portion group may include a sixth sub-inlet portion A adjacent to the fifth inlet portion group, and a sixth sub-inlet portion B disposed apart from the sixth sub-inlet portion A and adjacent to the first inlet portion group. The forming of the sealing member may include: applying voltage to the wiring unit by connecting the first sub-inlet portion A and the second sub-inlet portion B to an external power source; applying voltage to the wiring unit by connecting the second sub-inlet portion A and the third sub-inlet portion B to the external power source; applying voltage to the wiring unit by connecting the third sub-inlet portion A and the fourth sub-inlet portion B to the external power source; applying voltage to the wiring unit by connecting the fourth sub-inlet portion A and the fifth sub-inlet portion B to the external power source; applying voltage to the wiring unit by connecting the fifth sub-inlet portion A and the sixth sub-inlet portion B to the external power source; and applying voltage to the wiring unit by connecting the sixth sub-inlet portion A and the first sub-inlet portion B to the external power source.

The wiring unit may include a plurality of wiring members which are disposed apart from one another on at least one of a plurality of parts of the sealing member which overlap the wiring unit.

The plurality of wiring members may be disposed on the substrate. The sealing member may be disposed on the plurality of wiring members, and in regions where adjacent wiring members are disposed apart from one another.

The sealing member may include frit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, exemplary embodiments of the present invention will be described in detail with reference to the accompanying drawings.

Figure 1:
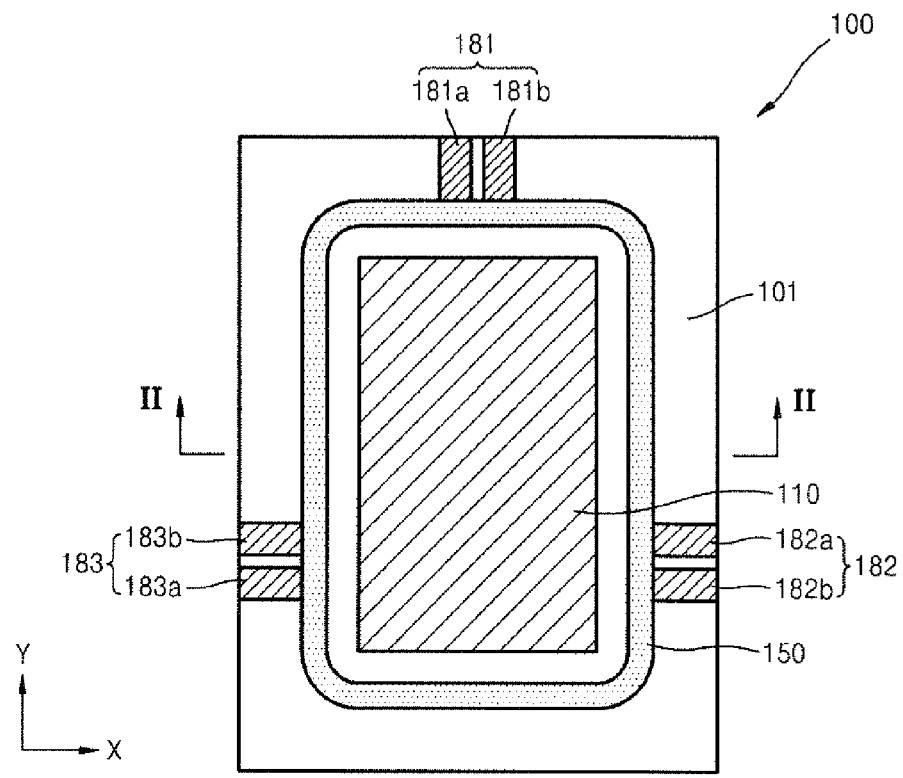
FIG. 1 is a schematic planar view of a flat panel display apparatus according to an embodiment of the present invention.
Figure 2:
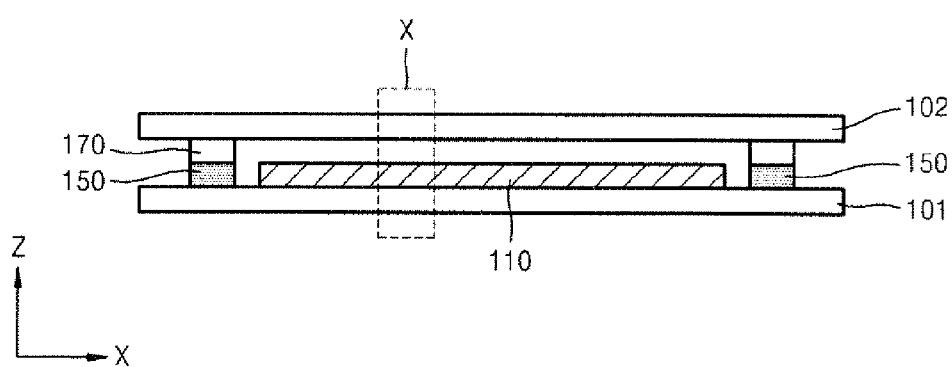
FIG. 2 is a cross-sectional view taken along the line II-II of FIG. 1.
Figure 3:
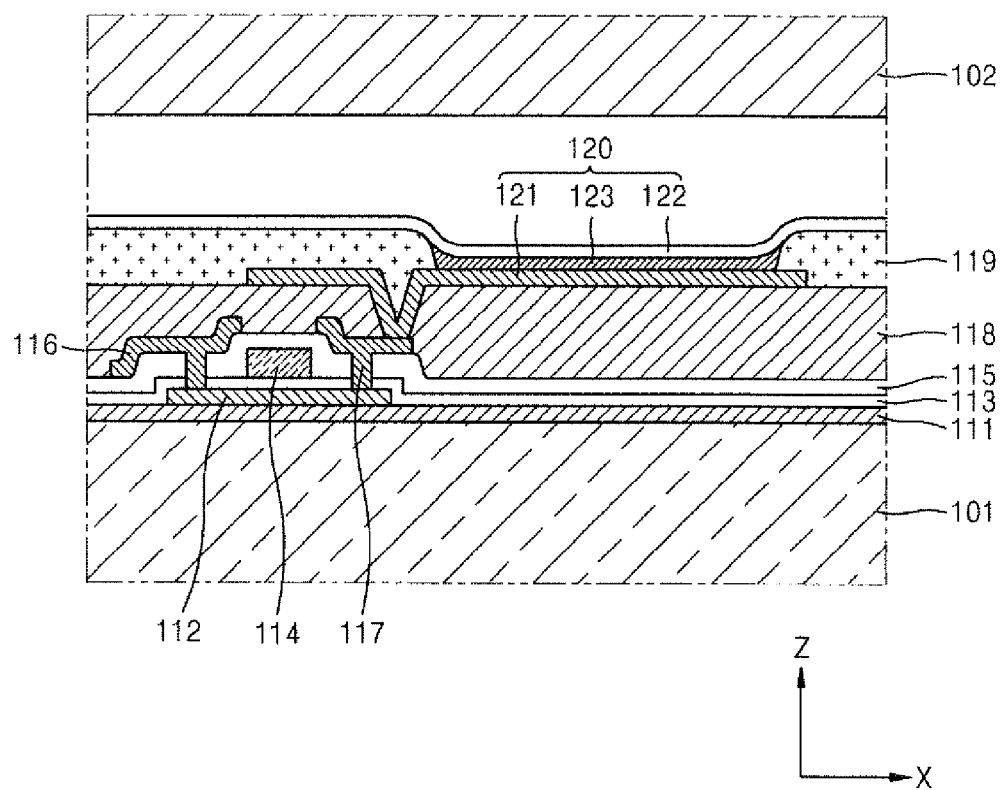
FIG. 3 is an enlarged view of a region X illustrated in FIG. 2.

FIG. 1 is a schematic planar view of a flat panel display apparatus according to an embodiment of the present invention, FIG. 2 is a cross-sectional view taken along the line II-II of FIG. 1, and FIG. 3 is an enlarged view of a region X illustrated in FIG. 2.

In FIG. 1, a sealing substrate 102 and a sealing member 170 (illustrated in FIG. 2) are not illustrated for convenience of explanation.

The flat panel display apparatus 100 includes a substrate 101, a display unit 110, the sealing substrate 102, a wiring unit 150, the sealing member 170, and first to third inlet portion groups 181, 182, and 183.

The first inlet portion group 181 includes a first sub-inlet portion A 181*a* and a first sub-inlet portion B 181*b*. The second inlet portion group 182 includes a second sub-inlet portion A 182*a* and a second sub-inlet portion B 182*b*. The third inlet portion group 183 includes a third sub-inlet portion A 183*a* and a third sub-inlet portion B 183*b*.

The constituent elements of the flat panel display apparatus 100 will now be described in greater detail with reference to FIGS. 1 to 3. The substrate 101 may be formed of $SiO_2$-based transparent glass material but is not limited thereto and may be formed of a transparent plastic material. In this case, the transparent plastic material may be an organic material selected from an insulating organic material group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), and cellulose triacetate (TAC), cellulose acetate propionate (CAP).

The display unit 110 is disposed on the substrate 101. The type of display unit 110 is not limited. In the current embodiment, the display unit 110 includes an organic light emitting device (OLED) 120 (see FIG. 3), but the present invention is not limited thereto and the display unit 110 may be a liquid crystal display device.

The sealing substrate 102 (FIG. 2) is disposed facing the display unit 110. The sealing member 170 is disposed between the substrate 101 and the sealing substrate 102. The sealing member 170 is formed so cover the display unit 110. The sealing member 170 facilitates combining the substrate 101 with the sealing substrate 102. The sealing member 170 may contain frit.

The wiring unit 150 is formed to overlap the sealing member 170. That is, the wiring unit 150 is formed surrounding the display unit 110. The wiring unit 150 is disposed on the substrate 101, the sealing member 170 is disposed on the wiring unit 150, and the sealing substrate 102 is disposed on the sealing member 170.

Specifically, during the manufacture of the flat panel display apparatus 100, the sealing member 170 may be manufactured by preparing a material of the sealing member 170, and applying voltage to the wiring unit 150 from an external power source so as to generate joule heat in the wiring unit 150 so that the material of the sealing member 170 may be fused and hardened by the joule heat.

The corners of the wiring unit 150 may not be squared may be rounded, thereby effectively preventing voltage from being abnormally applied to the corners of the wiring unit 150 when voltage is applied to the wiring unit 150 so as to fuse the material of the sealing member 170 during the manufacture of the flat panel display apparatus 100.

The width of the wiring unit 150 may correspond to that of the sealing member 170 or may be slightly less or greater than that of the sealing member 170 according to process conditions.

The first to third inlet portion groups 181 to 183 are connected to the wiring unit 150.

The first inlet portion group 181 includes the first sub-inlet portion A 181*a* and the first sub-inlet portion B 181*b*. The first sub-inlet portion A 181*a* and the first sub-inlet portion B 181*b* are connected to the wiring unit 150, and are disposed apart from each other.

Widths of the first sub-inlet portion A 181*a* and the first sub-inlet portion B 181*b* may each be greater than that of the wiring unit 150 so that, while voltage is applied to the wiring unit 150 so as to manufacture the sealing member 170, the first sub-inlet portion A 181*a* and the first sub-inlet portion B 181*b* may be prevented from abnormally heating and may be stably applied to wiring unit 150 in a simple manner.

The second inlet portion group 182 includes the second sub-inlet portion A 182*a* and the second sub-inlet portion B 182*b*. The second sub-inlet portion A 182*a* and the second sub-inlet portion B 182*b* are connected to the wiring unit 150, and are disposed apart from each other.

Widths of the second sub-inlet portion A 182*a* and the second sub-inlet portion B 182*b* may each be greater than that of the wiring unit 150 so that, while voltage is applied to the wiring unit 150 so as to manufacture the sealing member 170, the second sub-inlet portion A 182*a* and the second sub-inlet portion B 182*b* may be prevented from abnormally heating and may be stably applied to wiring unit 150 in an simple manner.

The third inlet portion group 183 includes the third sub-inlet portion A 183*a* and the third sub-inlet portion B 183*b*. The third sub-inlet portion A 183*a* and the third sub-inlet portion B 183*b* are connected to the wiring unit 150, and are disposed apart from each other.

Widths of the third sub-inlet portion A 183*a* and the third sub-inlet portion B 183*b* may each be greater than that of the wiring unit 150 so that, while voltage is applied to the wiring unit 150 so as to manufacture the sealing member 170, the third sub-inlet portion A 183*a* and the third sub-inlet portion B 183*b* may be prevented from abnormally heating and may be stably applied to wiring unit 150 in an simple manner.

In order to manufacture the sealing member 170, every two inlet portion groups may be sequentially selected from among the first to third inlet portion groups 181 to 183, and then, voltage may be applied to the selected inlet portion groups from an external power source. In this case, the wiring unit 150 may be divided into several parts, and voltage may be sequentially applied to the several parts of the wiring unit 150, rather than being applied to the entire wiring unit 150 at once.

Accordingly, it is possible to prevent a voltage drop (IR drop) from occurring in the entire wiring unit 150, thereby achieving uniform characteristics of the sealing member 170. In particular, since each of the first to third inlet portion groups 181 to 183 includes a plurality of sub-inlet portions, it is possible to prevent some of the parts of the wiring unit 150 from being abnormally and incompletely heated when voltage is applied to the wiring unit 150, as will be described in detail below with reference to FIGS. 4A to 4C.

The first to third inlet portion groups 181 to 183 are disposed adjacent to sides of the substrate 101 so that the first to third inlet portion groups 181 to 183 may be electrically connected to an external power source (not shown).

The first to third inlet portion groups 181 to 183 may be formed of a conductive material, for example, the same material as that of the wiring unit 150.

According to the present invention, the type of display unit 110 is not limited, and in particular, in the current embodiment, the display unit 110 includes the OLED 120 (FIG. 3). The display unit 110 will now be described in greater detail with reference to FIG. 3.

A buffer layer 111 is formed on the substrate 101. The buffer layer 111 may provide a plane surface on the substrate 101 and prevent moisture or foreign substances from permeating into the substrate 101.

An active layer 112 is formed on the buffer layer 111 in a predetermined pattern. The active layer 112 may be formed of an inorganic semiconductor material, such as amorphous silicon or polysilicon, or an organic semiconductor material. The active layer 112 includes a source region, a drain region, and a channel region.

The source and drain regions may be formed by doping the active layer 112, formed of amorphous silicon or polysilicon, with impurities. For example, when the active layer 112 is doped with boron (B), which is a Group III element, a p-type semiconductor layer is formed, and when the active layer 112 is doped with nitrogen (N), which is a Group V element, an n-type semiconductor layer is formed.

A gate insulating layer 113 is formed on the active layer 112, and a gate electrode 114 is formed in a predetermined region of the gate insulating layer 113. The gate insulating layer 113 insulates the active layer 112 and the gate electrode 114 from each other, and may be formed of an organic material or an inorganic material, such as $SiN_x$ or $SiO_2$.

The gate electrode 114 may be formed of a material selected from the group consisting of Au, Ag, Cu, Ni, Pt, Pd, Al, Mo, an Al:Nd alloy, or an Mo:W alloy, but is not limited thereto and may be formed of various materials, in consideration of adhesion property, planarizability, electrical resistance, processing suitability, etc. The gate electrode 114 is connected to a gate line (not shown) for supplying an electrical signal.

An interlayer insulating layer 115 is formed on the gate electrode 114. The interlayer insulating layer 115 and the gate insulating layer 113 are formed to expose the source and drain regions of the active layer 112. A source electrode 116 and a drain electrode 117 are formed in contact with the exposed source and drain regions, respectively, of the active layer 112.

The source electrode 116 and the drain electrode 117 may be formed of, but are not limited to, metal or a metal alloy selected from among Au, Pd, Pt, Ni, Rh, Ru, Ir, Os, Al, Mo, an Al:Nd alloy, or a MoW alloy.

A passivation layer 118 is formed covering the source electrode 116 and the drain electrode 117. The passivation layer 118 may include an inorganic insulating layer and/or an organic insulating layer. Examples of the inorganic insulating layer include $SiO_2$, $SiN_x$, $SiON$, $Al_2O_3$, $TiO_2$, $Ta_2O_5$, $HfO_2$, $ZrO_2$, BST, or PZT. Examples of the organic insulating layer include a general commercial polymer, e.g., polymethylmethacrylate (PMMA) or poly styrene (PS), phenol group-based polymer derivative, acryl-based polymer, imide-based polymer, aryl ether-based polymer, amide-based polymer, p-xylene-based polymer, polyvinyl alcohol-based polymer, and a composition thereof. The passivation layer 118 may include a stacked structure of an inorganic insulating layer and an organic insulating layer.

The passivation layer 118 is formed to expose the drain electrode 117, and the OLED 120 is connected to the exposed drain electrode 117. The OLED 120 includes a first electrode 121, a second electrode 122, and an intermediate layer 123. In particular, the first electrode 121 and the drain electrode 117 contact each other.

The intermediate layer 123 includes an organic emission layer, and emits visible light when voltage is applied to the intermediate layer 123 via the first electrode 121 and the second electrode 122.

A pixel defining layer 119 is formed on the first electrode 121 by using an insulating material. A predetermined aperture is formed in the pixel defining layer 119 so as to expose the first electrode 121. The intermediate layer 123 is formed on the exposed first electrode 121. The second electrode 122 is connected to the intermediate layer 123.

The first electrode 121 functions as an anode electrode and the second electrode 122 functions as a cathode electrode, or vice versa.

The sealing substrate 102 is disposed on the second electrode 122.

Figure 4A:
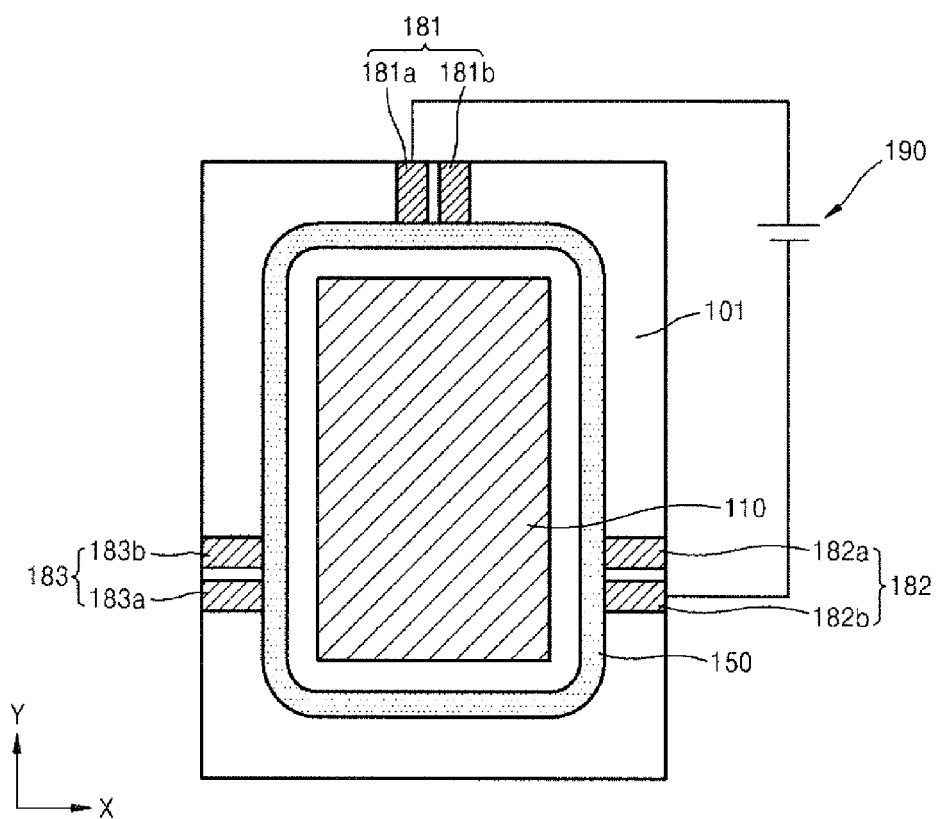
FIGS. 4A to 4C are schematic planar views sequentially illustrating operations of manufacturing a sealing member during the manufacture of the flat panel display apparatus of FIG. 1 according to an embodiment of the present invention.
Figure 4B:
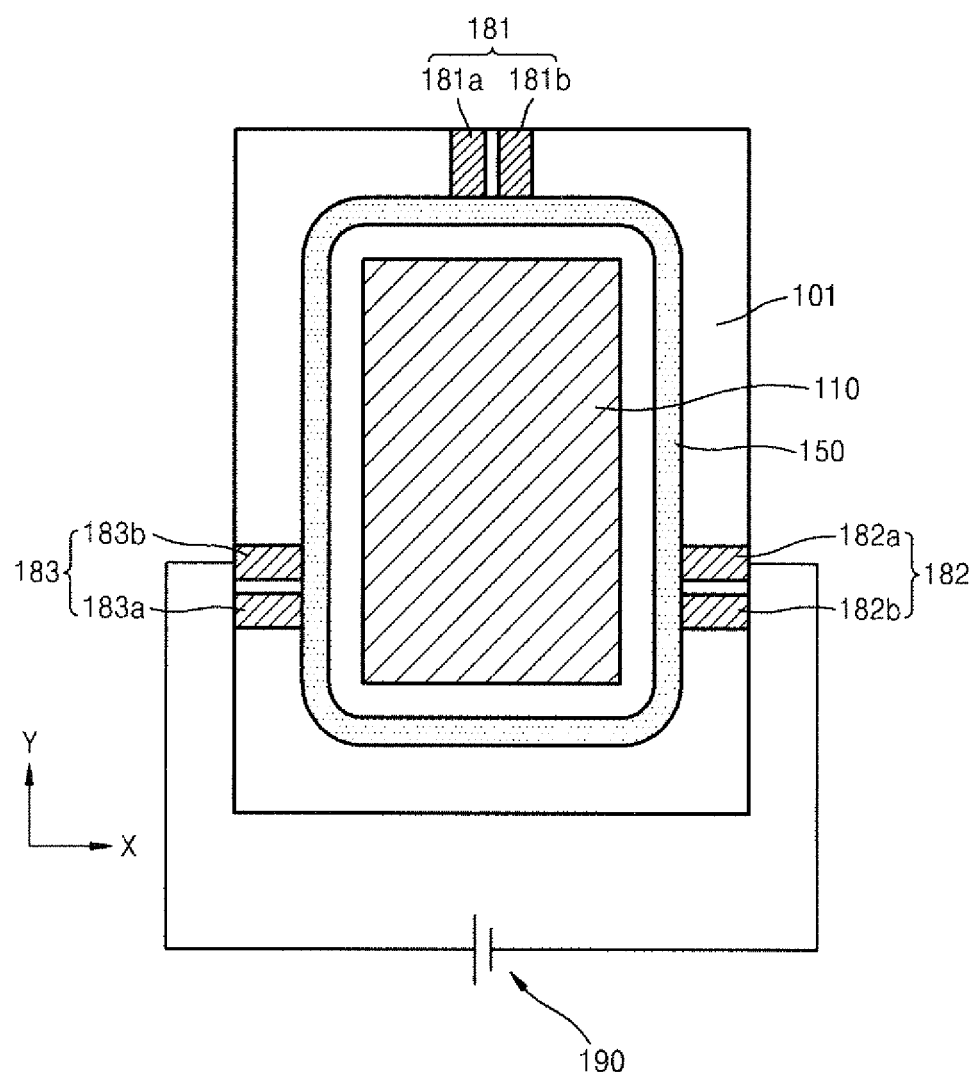
Figure 4C:
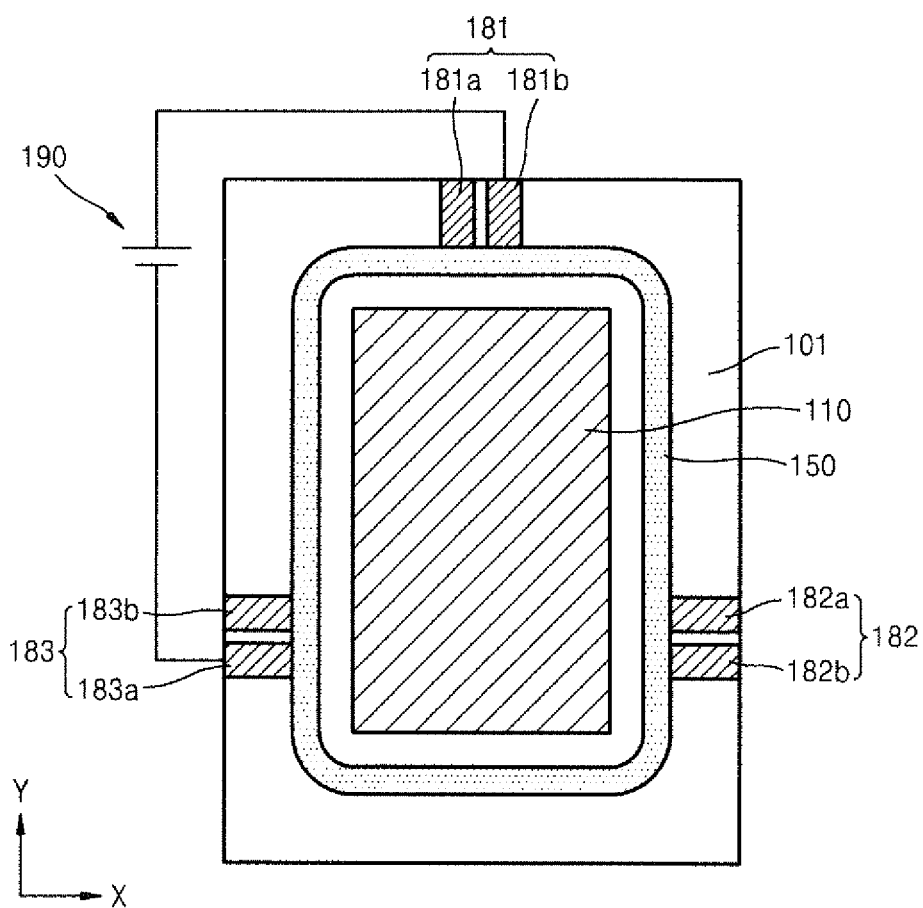

FIGS. 4A thru 4C are schematic planar views sequentially illustrating operations of manufacturing the sealing member during the manufacture of the flat panel display apparatus of FIG. 1 according to an embodiment of the present invention.

In detail, FIGS. 4A thru 4C illustrate an operation of applying voltage to the wiring unit 150 from an external power source 190 so as to manufacture the sealing member 170.

A process of manufacturing the flat panel display apparatus 100 of FIG. 1 includes various operations, one of which is an operation of manufacturing the sealing member 170. The operation of manufacturing the sealing member 170 includes preparing a material of the sealing member 170, and applying voltage to the wiring unit 150 so as to fuse and harden this material.

Specifically, first, referring to FIG. 4A, the terminals of the external power source 190 are connected to the first sub-inlet portion A 181*a* of the first inlet portion group 181 and the second sub-inlet portion B 182*b* of the second inlet portion group 182, respectively. Next, when voltage is applied to the wiring unit 150, joule heat is generated mainly in a region of the wiring unit 150 between the first sub-inlet portion A 181*a* and the second sub-inlet portion B 182*b*. Then, the material of the sealing member 170, which is disposed to overlap the wiring unit 150, is easily fused and hardened.

Next, referring to FIG. 4B, both terminals of the external power source 190 are connected to the second sub-inlet portion A 182*a* of the second inlet portion group 182 and the third sub-inlet portion B 183*b* of the third inlet portion group 183, respectively. Next, when voltage is applied to the wiring unit 150, joule heat is generated mainly in a region of the wiring unit 150 between the second sub-inlet portion A 182*a* and the third sub-inlet portion B 183*b*. Then, the material of the sealing member 170, which is disposed to overlap the wiring unit 150, is easily fused and hardened. That is, voltage is applied several times to predetermined parts of the wiring unit 150, and thus, the sealing member 170 is appropriately heated so as to be completely fused and hardened.

In particular, as described above, the external power source 190 is connected to the second sub-inlet portion B 182*b* (see FIG. 4A) and is connected to the second sub-inlet portion A 182*a* (see FIG. 4B) so as to appropriately apply voltage to the parts of the wiring unit 150 corresponding to the second sub-inlet portion A 182*a* and the second sub-inlet portion B 182b, and to the part of the wiring unit 150 between the second sub-inlet portion A 182a and the second sub-inlet portion B 182b, thereby preventing the material of the sealing member 170 from being abnormally or incompletely fused.

Thereafter, referring to FIG. 4C, the two terminals of the external power source 190 are connected to the third sub-inlet portion A 183a of the third inlet portion group 183 and to the first sub-inlet portion B 181b of the first inlet portion group 181, respectively. Next, when voltage is applied to the wiring unit 150, joule heat is generated mainly in a part of the wiring unit 150 between the third sub-inlet portion A 183a and the first sub-inlet portion B 181b. Thus, the material of the sealing member 170, which is disposed to overlap the wiring unit 150, is easily fused and hardened.

In particular, as described above, the external power source 190 is connected to the third sub-inlet portion B 183b (see FIG. 4B) and is connected to the third sub-inlet portion A 183a (see FIG. 4C) so as to appropriately apply voltage to the parts of the wiring unit 150 corresponding to the third sub-inlet portion B 183a and the third sub-inlet portion B 183b, and to the part of the wiring unit 150 between the third sub-inlet portion B 183a and the third sub-inlet portion B 183b, thereby preventing the material of the sealing member 170 from being abnormally or incompletely fused.

Also, the external power source 190 is connected to the first sub-inlet portion A 181a (see FIG. 4A) and is connected to the first sub-inlet portion B 181b (see FIG. 4C) so as to appropriately apply voltage to the parts of the wiring unit 150 corresponding to the first sub-inlet portion A 181a and the first sub-inlet portion B181b, and to the part of the wiring unit 150 between the first sub-inlet portion A 181a and the first sub-inlet portion B181b, thereby preventing the material of the sealing member 170 from being abnormally or incompletely fused.

When voltage is applied to the wiring unit 150, an IR drop may occur in some of the parts of the wiring unit 150 since the wiring unit 150 is formed to be long. Thus, the material of the sealing member 170 is likely to be unequally fused, thereby causing the sealing member 170 to have non-uniform characteristics. However, in the current embodiment, the first to third inlet portion groups 181 to 183 are used, every two inlet portion groups are sequentially selected therefrom, and voltage is applied to the selected inlet portion groups. Accordingly, an IR drop is prevented from occurring in the entire wiring unit 150, and joule heat is equally generated in the entire wiring unit 150. Therefore, the material of the sealing member 170 is completely fused and hardened, and the sealing member 170 has uniform characteristics. As a result, the substrate 101 and the sealing substrate 102 may be easily combined with each other, and encapsulating characteristics of the flat panel display apparatus 100 may be improved.

Figure 5:
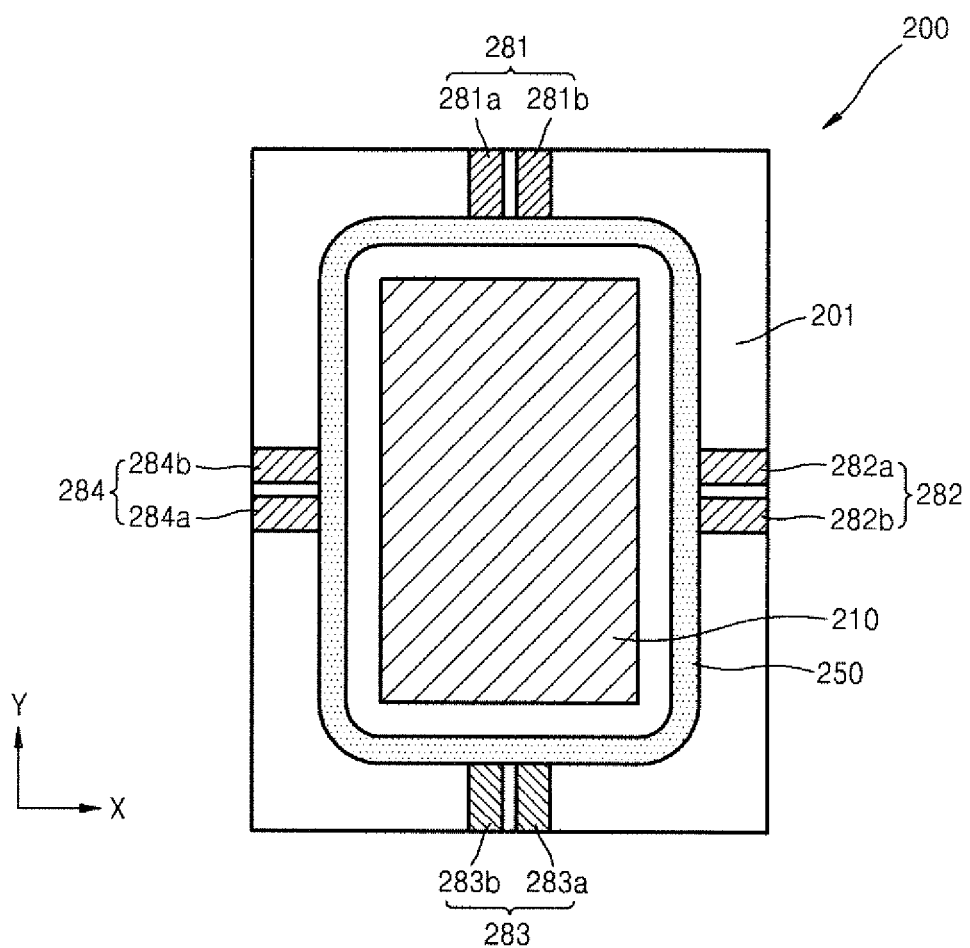
FIG. 5 is a schematic planar view of a flat panel display apparatus according to another embodiment of the present invention.

FIG. 5 is a schematic planar view of a flat panel display 200 according to another embodiment of the present invention.

In FIG. 5, a sealing substrate and a sealing member are not illustrated for convenience of explanation, and the flat panel display apparatus 200 will be described by focusing on the differences between the flat panel display apparatus 200 and the flat panel display apparatus 100 according to the previous embodiment.

The flat panel display apparatus 200 includes a substrate 201, a display unit 210, the sealing substrate, a wiring unit 250, the sealing member, and the first to fourth inlet portion groups 281, 282, 283, and 284.

The constituent elements of the flat panel display apparatus 200 will now be described in greater detail with reference to FIG. 5. The display unit 210 is disposed on the substrate 201. The sealing substrate is disposed facing the display unit 210.

The sealing member is disposed between the substrate 201 and the sealing substrate. The sealing member is formed covering the display unit 210. The sealing member facilitates combining the substrate 201 with the sealing substrate. The sealing member may contain frit.

The wiring unit 250 is formed to overlap the sealing member. That is, the wiring unit 250 is formed surrounding the display unit 210. The wiring unit 250 is disposed on the substrate 201, the sealing member is disposed on the wiring unit 250, and the sealing substrate is disposed on the sealing member.

The first to fourth inlet portion groups 281 to 284 are connected to the wiring unit 250.

The first inlet portion group 281 includes a first sub-inlet portion A 281a and a first sub-inlet portion B 281b. The first sub-inlet portion A 281a and the first sub-inlet portion B 281b are connected to the wiring unit 250, and are disposed apart from each other. Widths of the first sub-inlet portion A 281a and the first sub-inlet portion B 281b may each be greater than that of the wiring unit 250.

The second inlet portion group 282 includes a second sub-inlet portion A 282a and a second sub-inlet portion B 282b. The second sub-inlet portion A 282a and the second sub-inlet portion B 282b are connected to the wiring unit 250, and are disposed apart from each other. Widths of the second sub-inlet portion A 282a and the second sub-inlet portion B 282b may each be greater than that of the wiring unit 250.

The third inlet portion group 283 includes a third sub-inlet portion A 283a and a third sub-inlet portion B 283b. The third sub-inlet portion A 283a and the third sub-inlet portion B 283b are connected to the wiring unit 250, and are disposed apart from each other. Widths of the third sub-inlet portion A 283a and the third sub-inlet portion B 283b may each be greater than that of the wiring unit 250.

The fourth inlet portion group 284 includes a fourth sub-inlet portion A 284a and a fourth sub-inlet portion B 284b. The fourth sub-inlet portion A 284 and the fourth sub-inlet portion B 284b are connected to the wiring unit 250, and are disposed apart from each other. Widths of the fourth sub-inlet portion A 284a and the fourth sub-inlet portion B 284b may each be greater than that of the wiring unit 250.

During the manufacture of the sealing member, every two inlet portion groups are sequentially selected from among the first to fourth inlet portion groups 281 to 284, and voltage is sequentially applied to the selected inlet portion groups from an external power source (not shown). Thus, uniform characteristics of the sealing member may be obtained by preventing an IR drop from occurring in the entire wiring unit 250. In particular, since each of the first to fourth inlet portion groups 281 to 284 includes a plurality of sub-inlet portions, it is possible to prevent some parts of the wiring unit 250 from being abnormally or incompletely heated, as will be described in detail below with reference to FIGS. 6A to 6D.

The first to fourth inlet portion groups 281 to 284 are disposed adjacent to sides of the substrate 201 so as to be easily, electrically connected to the external power source.

The first to fourth inlet portion groups 281 to 284 may be formed of a conductive material, and particularly, the same material as that of the wiring unit 250.

In the current embodiment, the type of display unit 210 is not limited, and the display unit 210 may be an OLED or a liquid crystal display device.

FIGS. 6A to 6D are schematic planar views sequentially illustrating operations of manufacturing a sealing member (not shown) during the manufacture of the flat panel display apparatus of FIG. 5 according to another embodiment of the present invention.

In detail, FIGS. 6A to 6D illustrate an operation of applying voltage to the wiring unit 250 from an external power source 290 so as to manufacture the sealing member.

A process of manufacturing the flat panel display apparatus 200 of FIG. 5 includes various operations, one of which is an operation of manufacturing the sealing member. The operation of manufacturing the sealing member includes preparing a material of the sealing member, and applying voltage to the wiring unit 250 so as to fuse and harden this material.

Figure 6A:
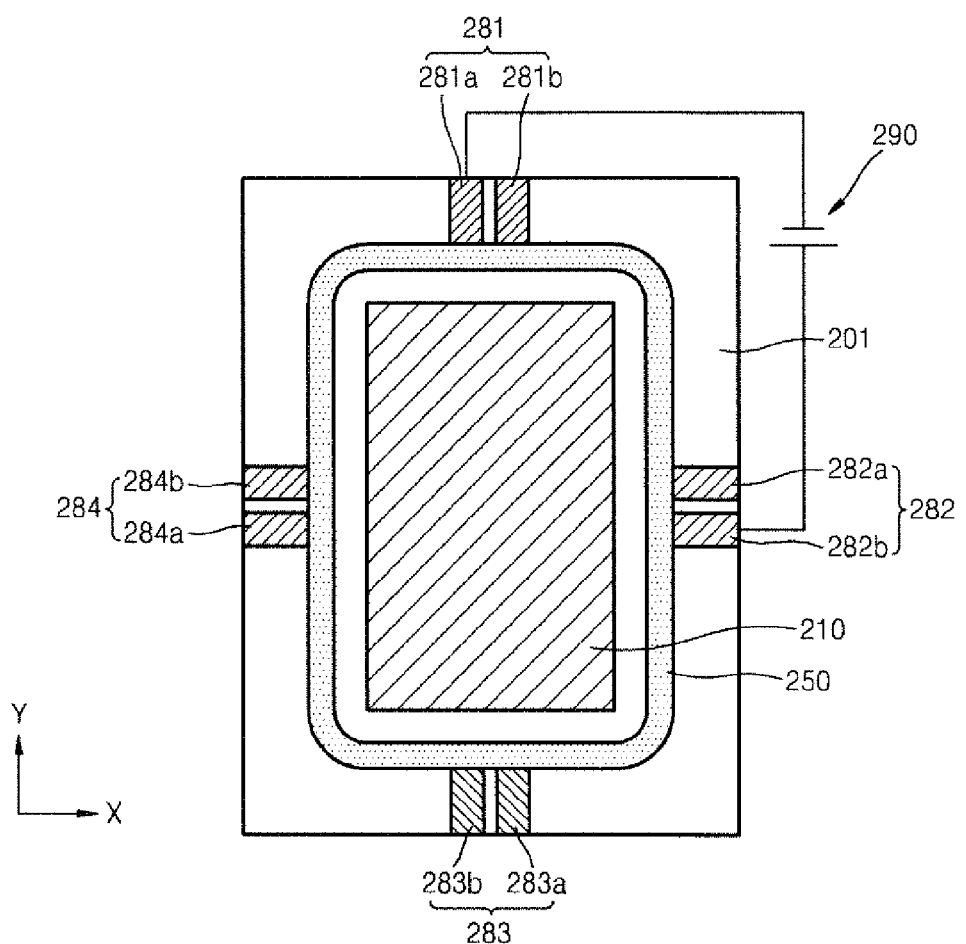
FIGS. 6A to 6D are schematic planar views sequentially illustrating operations of manufacturing a sealing member during the manufacture of the flat panel display apparatus of FIG. 5 according to another embodiment of the present invention.

First, referring to FIG. 6A, the ends of the external power source 290 are connected to the first sub-inlet portion A 281a of the first inlet portion group 281 and the second sub-inlet portion B 282b of the second inlet portion group 282, respectively. Next, when voltage is applied to the wiring unit 250, joule heat is generated mainly in a part of the wiring unit 250 between the first sub-inlet portion A 281a and the second sub-inlet portion B 282b. Thus, the material of the sealing member, disposed to overlap the wiring unit 250, is easily fused and hardened.

Figure 6B:
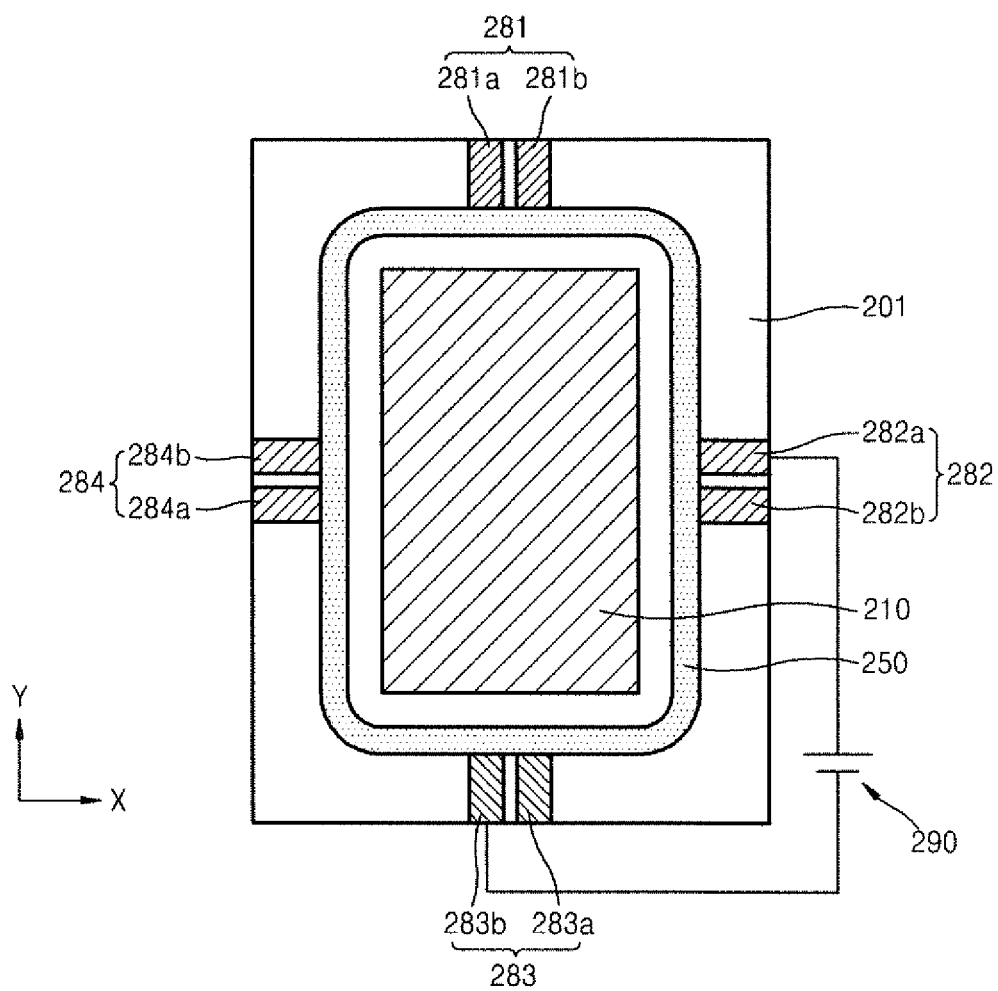

Next, referring to FIG. 6B, the two terminals of the external power source 290 are connected to the second sub-inlet portion A 282a of the second inlet portion group 282 and to the third sub-inlet portion B 283b of the third inlet portion group 283, respectively. Then, when voltage is applied to the wiring unit 250, joule heat is generated mainly in a part of the wiring unit 250 between the second sub-inlet portion A 282a and the third sub-inlet portion B 283b. Thus, the material of the sealing member, disposed to overlap the wiring unit 250, is easily fused and hardened.

Particularly, as described above, the external power source 290 is connected to the second sub-inlet portion B 282b (see FIG. 6A) and is connected to the second sub-inlet portion A 282a (see FIG. 6B) so as to appropriately apply voltage to parts of the wiring unit 250 corresponding to the second sub-inlet portion A 282a and the second sub-inlet portion B 282b, and to the part of the wiring unit between the second sub-inlet portion A 282a and the second sub-inlet portion B 282b, thereby preventing the material of the sealing member from being abnormally or incompletely fused.

Figure 6C:
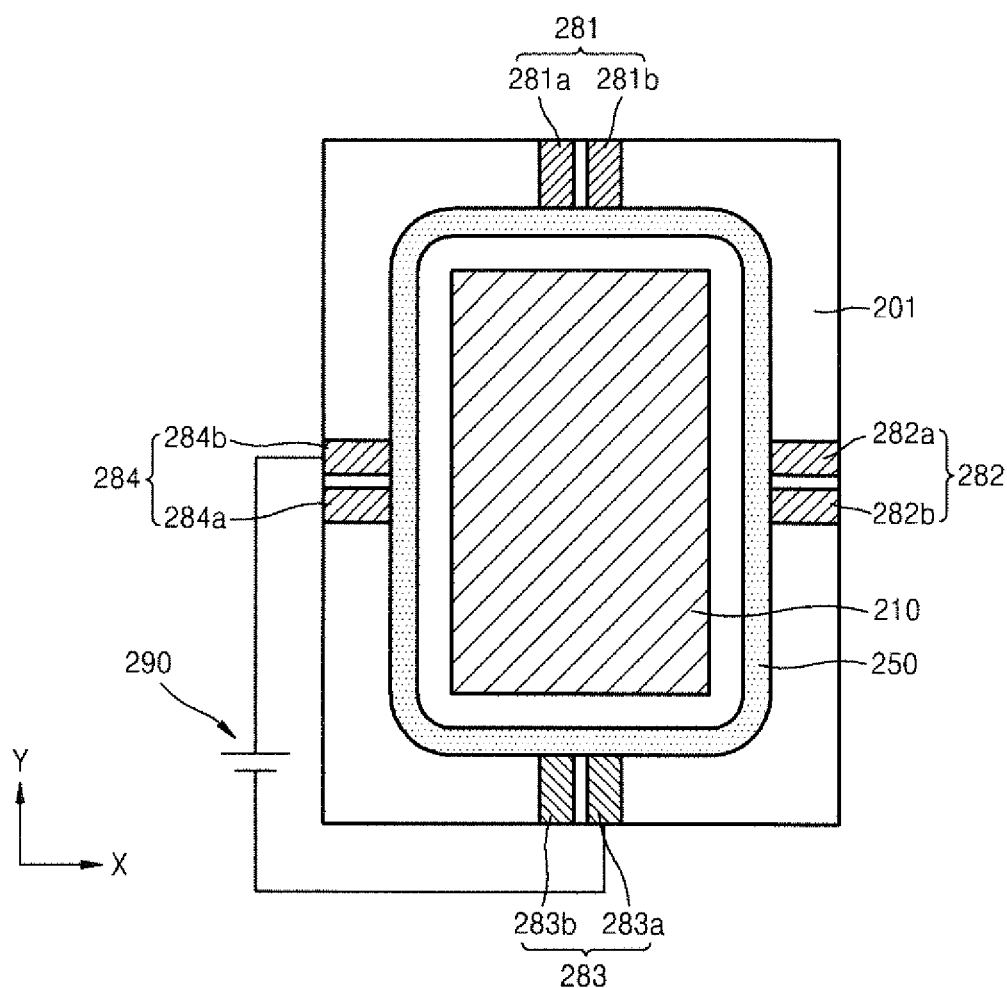

Next, referring to FIG. 6C, the two terminals of the external power source 290 are connected to the third sub-inlet portion A 283a of the third inlet portion group 283 and to the fourth sub-inlet portion B 284b of the fourth inlet portion group 284, respectively. Then, when voltage is applied to the wiring unit 250, joule heat is generated mainly in a part of the wiring unit 250 between the third sub-inlet portion A 283a and the fourth sub-inlet portion B 284b. Thus, the material of the sealing member, disposed to overlap the wiring unit 250, is easily fused and hardened.

In particular, as described above, the external power source 290 is connected to the third sub-inlet portion B 283b (see FIG. 6B) and is connected to the third sub-inlet portion A 283a (see FIG. 6C) so as to appropriately apply voltage to parts of the wiring unit 250 corresponding to the third sub-inlet portion A 283a and the third sub-inlet portion B 283b, and to the part of the wiring unit 250 between the third sub-inlet portion A 283a and the third sub-inlet portion B 283b, thereby preventing the material of the sealing member from being abnormally or incompletely fused.

Figure 6D:
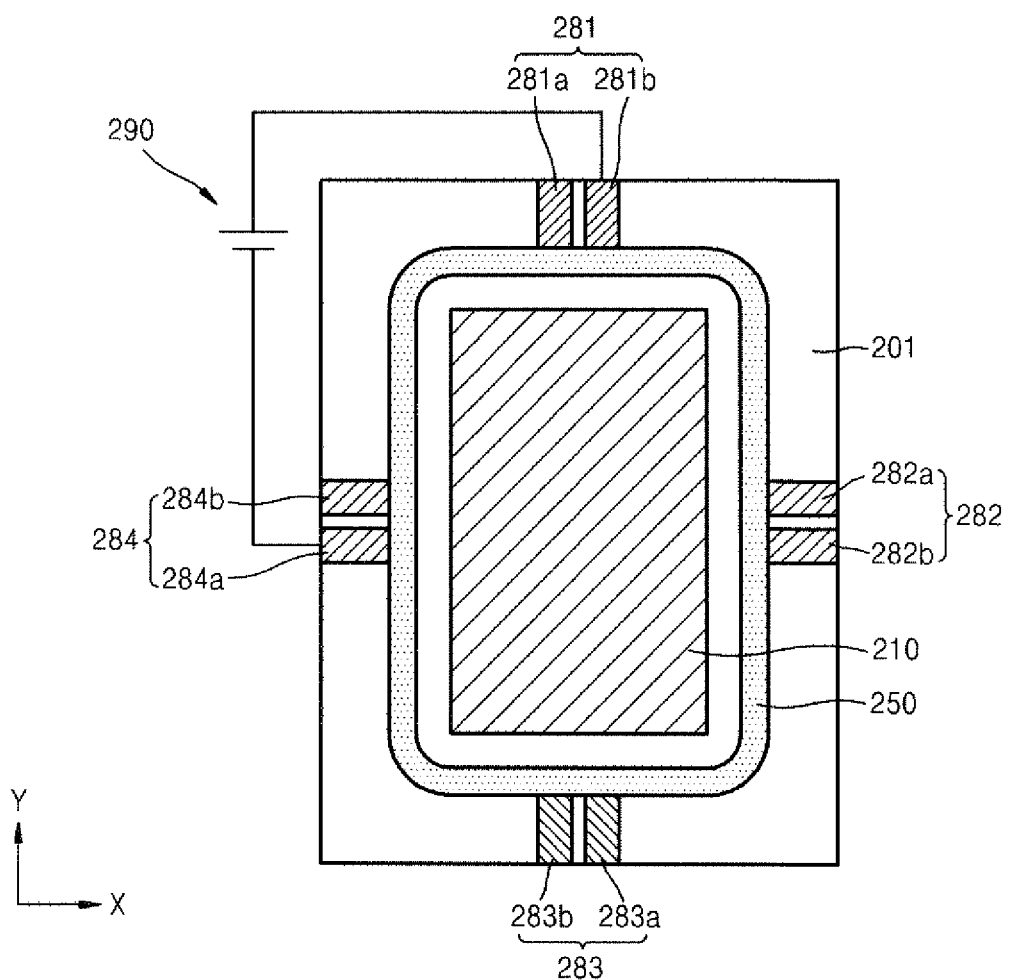

Next, referring to FIG. 6D, the two terminals of the external power source 290 are connected to the fourth sub-inlet portion A 284a of the fourth inlet portion group 284 and to the first sub-inlet portion B 281b of the first inlet portion group 281, respectively. Then, when voltage is applied to the wiring unit 250, joule heat is generated mainly in a part of the wiring unit 250 between the fourth sub-inlet portion A 284a and the first sub-inlet portion B 281b. Thus, the material of the sealing member, disposed to overlap the wiring unit 250, is easily fused and hardened.

In particular, as described above, the external power source 290 is connected to the fourth sub-inlet portion B 284b (see FIG. 6C) and is connected to the fourth sub-inlet portion A 284a (see FIG. 6D) so as to appropriately apply voltage to parts of the wiring unit 250 corresponding to the fourth sub-inlet portion A 284a and the fourth sub-inlet portion B 284b, and to the part of the wiring unit 250 between the fourth sub-inlet portion A 284a and the fourth sub-inlet portion B 284b, thereby preventing the material of the sealing member from being abnormally or incompletely fused.

Also, the external power source 290 is connected to the first sub-inlet portion A 281a (see FIG. 6A) and is connected to the first sub-inlet portion B 281b (see FIG. 6D) so as to appropriately apply voltage to parts of the wiring unit 250 corresponding to the first sub-inlet portion A 281a and the first sub-inlet portion B 281b, and to the part of the wiring unit between the first sub-inlet portion A 281a and the first sub-inlet portion B 281b, thereby preventing the material of the sealing member from being abnormally or incompletely fused.

When voltage is applied to the wiring unit 250, an IR drop may occur in some of the parts of the wiring unit 250 since the wiring unit 250 is formed to be long. Thus, the material of the sealing member is likely to be unequally fused, thereby causing the sealing member to have non-uniform characteristics. However, in the current embodiment, the first to fourth inlet portion groups 281 to 284 are used, every two inlet portion groups are sequentially selected therefrom, and voltage is applied to the parts of the wiring unit 250 corresponding to the selected inlet portion groups. Accordingly, an IR drop is prevented from occurring in the entire wiring unit 250, and joule heat is equally generated in the entire wiring unit 250. Therefore, the material of the sealing member is completely fused and hardened, and the sealing member has uniform characteristics. As a result, the substrate 201 and the sealing substrate may be easily combined with each other, and encapsulating characteristics of the flat panel display apparatus 200 may be improved.

Figure 7:
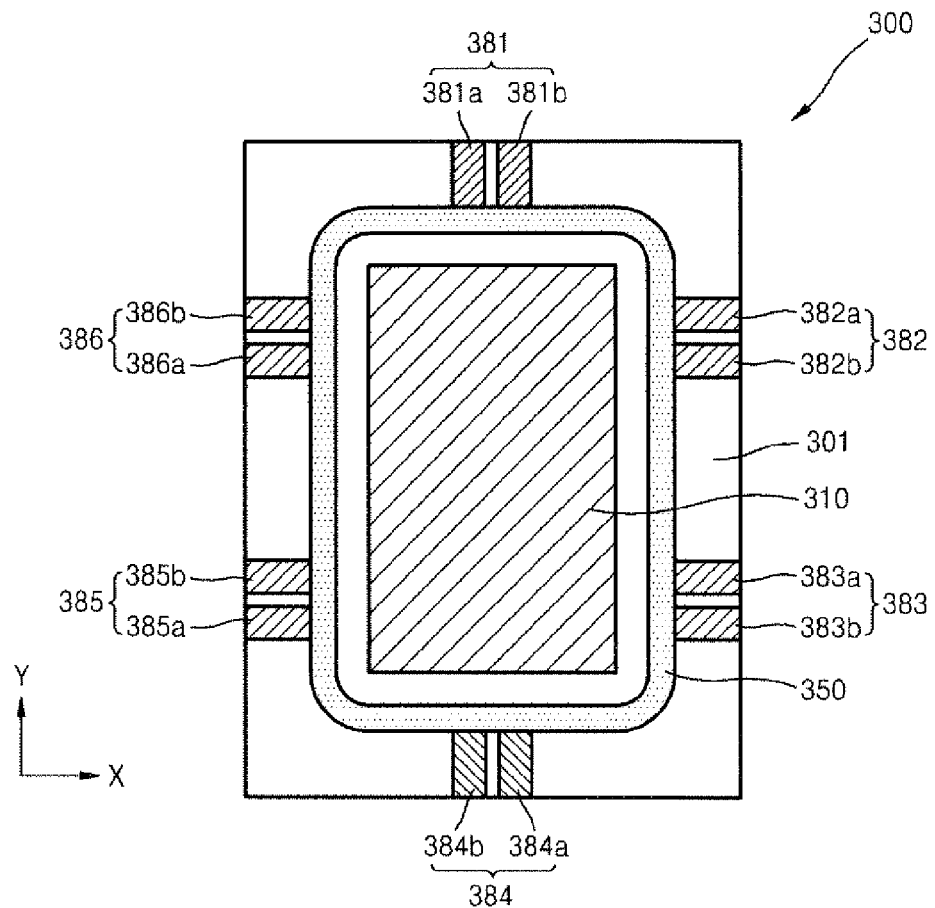
FIG. 7 is a schematic planar view of a flat panel display apparatus according to another embodiment of the present invention.

FIG. 7 is a schematic planar view of a flat panel display apparatus according to another embodiment of the present invention.

In FIG. 7, a sealing substrate and a sealing member are not illustrated for convenience of explanation, and the flat panel display apparatus 300 will be described focusing on the differences between the flat panel display apparatus 300 and the flat panel display apparatuses 100 and 200 according to the previous embodiments.

The flat panel display apparatus 300 includes a substrate 301, a display unit 310, the sealing substrate, a wiring unit 350, the sealing member, and first to sixth inlet portion groups 381, 382, 383, 384, 385, and 386.

The constituent elements of the flat panel display apparatus 300 will now be described in greater detail with reference to FIG. 7. The display unit 310 is disposed on the substrate 301. The sealing substrate is disposed facing the display unit 310. The sealing member is disposed between the substrate 301 and the sealing substrate. The sealing member is formed surrounding the display unit 310. The sealing member facilitates combining the substrate 301 with the sealing substrate. The sealing member may contain frit.

The wiring unit 350 is disposed to overlap the sealing member. That is, the wiring unit 350 is formed to surround the display unit 310. The wiring unit 350 is disposed on the substrate 301, the sealing member is disposed on wiring unit 350, and the sealing substrate is disposed on the sealing member.

The first to sixth inlet portion groups 381 to 386 are connected to the wiring unit 350.

The first inlet portion group 381 includes a first sub-inlet portion A 381a and a first sub-inlet portion B 381b. The first sub-inlet portion A 381a and the first sub-inlet portion B 381b are connected to the wiring unit 350, and are disposed apart from each other. Widths of the first sub-inlet portion A 381a and the first sub-inlet portion B 381b may each be greater than that of the wiring unit 350.

The second inlet portion group 382 includes a second sub-inlet portion A 382a and a second sub-inlet portion B 382b. The second sub-inlet portion A 382a and the second sub-inlet portion B 382b are connected to the wiring unit 350, and are disposed apart from each other. Widths of the second sub-inlet portion A 382a and the second sub-inlet portion B 382b may each be greater than that of the wiring unit 350.

The third inlet portion group 383 includes a third sub-inlet portion A 383a and a third sub-inlet portion B 383b. The third sub-inlet portion A 383a and the third sub-inlet portion B 383b are connected to the wiring unit 350, and are disposed apart from each other. Widths of the third sub-inlet portion A 383a and the third sub-inlet portion B 383b may each be greater than that of the wiring unit 350.

The fourth inlet portion group 384 includes a fourth sub-inlet portion A 384a and a fourth sub-inlet portion B 384b. The fourth sub-inlet portion A 384a and the fourth sub-inlet portion B 384b are connected to the wiring unit 350, and are disposed apart from each other. Widths of the fourth sub-inlet portion A 384a and the fourth sub-inlet portion B 384b may each be greater than that of the wiring unit 350.

The fifth inlet portion group 385 includes a fifth sub-inlet portion A 385a and a fifth sub-inlet portion B 385b. The fifth sub-inlet portion A 385a and the fifth sub-inlet portion B 385b are connected to the wiring unit 350, and are disposed apart from each other. Widths of the fifth sub-inlet portion A 385a and the fifth sub-inlet portion B 385b may each be greater than that of the wiring unit 350.

The sixth inlet portion group 386 includes a sixth sub-inlet portion A 386a and a sixth sub-inlet portion B 386b. The sixth sub-inlet portion A 386a and the sixth sub-inlet portion B 386b are connected to the wiring unit 350, and are disposed apart from each other. Widths of the sixth sub-inlet portion A 386a and the sixth sub-inlet portion B 386b may each be greater than that of the wiring unit 350.

During the manufacture of the sealing member, every two inlet portion groups are sequentially selected from among the first to sixth inlet portion groups 381 to 386, and voltage is sequentially applied to the selected inlet portion groups from an external power source (not shown). Thus, uniform characteristics of the sealing member may be obtained by preventing an IR drop from occurring in the entire wiring unit 350. In particular, since each of the first to sixth inlet portion groups 381 to 386 includes a plurality of sub-inlet portions, it is possible to prevent some parts of the wiring unit 350 from being abnormally or incompletely heated.

The first to sixth inlet portion groups 381 to 386 are disposed adjacent to sides of the substrate 301 so as to be easily, electrically connected to the external power source.

The first to sixth inlet portion groups 381 to 386 may be formed of a conductive material, and in particular, the same material as that of the wiring unit 350.

In the current embodiment, the type of the display unit 310 is not limited, and the display unit 310 may be an OLED or a liquid crystal display device.

Although not shown, during the manufacture of the flat panel display apparatus 300, an operation of applying voltage to the wiring unit 350 from the external power source so as to manufacture the sealing member is similar to those operations described above in the previous embodiments.

That is, a material of the sealing member may be prepared, and voltage may be applied six times to the wiring unit 350 so as to fuse and harden this material.

Specifically, first, voltage is applied to the wiring unit 350 by connecting the terminals of the external power source to the first sub-inlet portion A 381a of the first inlet portion group 381 and to the second sub-inlet portion B 382b of the second inlet portion group 382, respectively. Next, voltage is applied to the wiring unit 350 by connecting the terminals of the external power source to the second sub-inlet portion A 382a of the second inlet portion group 382 and to the third sub-inlet portion B 383b of the third inlet portion group 383, respectively. Next, voltage is applied to the wiring unit 350 by connecting the terminals of the external power source to the third sub-inlet portion A 383a of the third inlet portion group 383 and to the fourth sub-inlet portion B 384b of the fourth inlet portion group 384, respectively. Next, voltage is applied to the wiring unit 350 by connecting the terminals of the external power source to the fourth sub-inlet portion A 384a of the fourth inlet portion group 384 and to the fifth sub-inlet portion B 385b of the fifth inlet portion group 385, respectively. Next, voltage is applied to the wiring unit 350 by connecting the terminals of the external power source to the fifth sub-inlet portion A 385a of the fifth inlet portion group 385 and to the sixth sub-inlet portion B 386b of the sixth inlet portion group 386, respectively. Thereafter, voltage is applied to the wiring unit 350 by connecting the terminals of the external power source to the sixth sub-inlet portion A 386a of the sixth inlet portion group 386 and to the first sub-inlet portion B 381b of the first inlet portion group 381, respectively.

Figure 8:
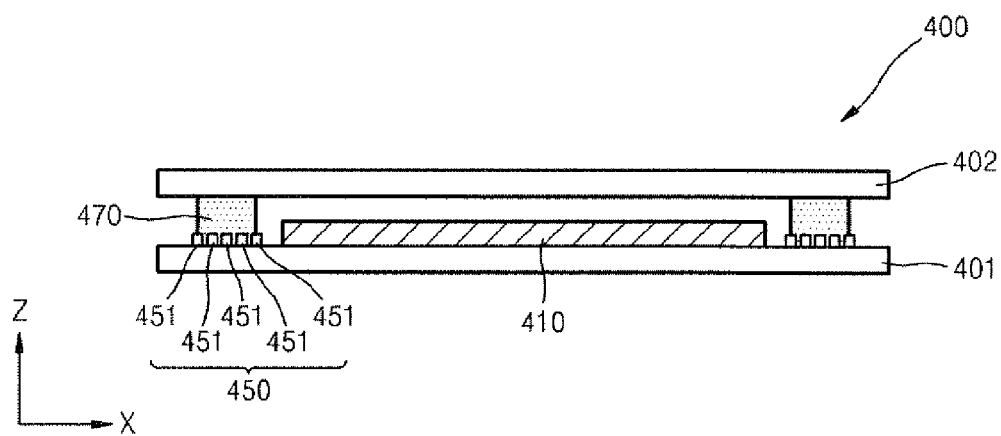
FIG. 8 is a schematic cross-sectional view of a flat panel display apparatus according to another embodiment of the present invention.

FIG. 8 is a schematic cross-sectional view of a flat panel display apparatus according to another embodiment of the present invention.

The flat panel display apparatus 400 is different from the flat panel display apparatuses 100 to 300 according to the previous embodiments only in terms of the structure of a wiring unit 450. Thus, the flat panel display apparatus 400 will be described by focusing on the differences between the flat panel display apparatus 400 and the flat panel display apparatuses 100 to 300 according to the previous embodiments.

The flat panel display apparatus 400 includes a substrate 401, a display unit 410, a sealing substrate 402, a wiring unit 450, a sealing member 470, and a plurality of inlet portion groups (not shown). The plurality of inlet portion groups of the flat panel display apparatus 400 are the same as those of one of the flat panel display apparatuses 100 to 300 illustrated in FIGS. 1, 5, and 7, respectively, and will thus not be described again here The constituent elements of the flat panel display apparatus 400 will now be described in greater detail with reference to FIG. 8. The display unit 410 is disposed on the substrate 401. The sealing substrate 402 is disposed facing the display unit 410. The sealing member 470 is disposed between the substrate 401 and the sealing substrate 402. The sealing member 470 is formed surrounding the display unit 410. The sealing member 470 facilitates combining the substrate 401 with the sealing substrate 402. The sealing member may contain frit.

The wiring unit 450 includes a plurality of wiring members 451. The wiring members 451 are disposed apart from one another on at least one of the parts of the sealing member 470 which overlap plurality of wiring members 451. The plurality of wiring members 451 are disposed on the substrate 401, the sealing member 470 is disposed on the plurality of wiring members 451 and in a region where the plurality of wiring members 451 are disposed apart from one another, and the sealing substrate 402 is disposed on the sealing member 470.

Since the sealing member 470 contacts the substrate 401 via the region where the wiring members 451 are disposed apart from one another, the durability of the sealing member 470 and bonding characteristics between the substrate 401 and the sealing substrate 402 are improved.

The plurality of wiring members 451 of the wiring unit 450 will now be described in detail. During the manufacture of the sealing member 470, a material of the sealing member 470 is prepared, and voltage is applied to the wiring unit 450 from an external power source (not shown) so as to generate joule heat in the wiring unit 450. Then, the material is fused and hardened by the joule heat, thus forming the sealing member 470.

In the current embodiment, since the wiring unit 450 includes the plurality of wiring members 451, a temperature variation between a center and peripheral regions of the sealing member 470 in a width direction may be prevented.

Also, since the wiring unit 450 includes the plurality of wiring members 451, it is possible to prevent current from being unequally supplied to the inside and outside of corner regions of the wiring unit 450. Specifically, a large amount of current is prevented from being supplied to the inside of a corner region of the wiring unit 450 adjacent to the display unit 410, thereby allowing the same amount of current to flow through the entire wiring unit 450. Accordingly, the sealing member 470 may be equally heated.

During the manufacture of the flat panel display apparatus 400, an operation of applying voltage to the wiring unit 450 from the external power source so as to manufacture the sealing member 470 is similar to those described above in the previous embodiments, and will thus not be described again here.

In the above embodiments, the number of inlet portion groups included in a flat panel display apparatus is three, four or six, but the present invention is not limited thereto. In other words, a flat panel display apparatus according to an embodiment of the present invention may include three or more inlet portion groups, and the number of inlet portion groups may be determined according to the size of the flat panel display apparatus and process conditions. Also, in the above embodiments, two sub-inlet portions are included in each inlet portion group, but the present invention is not limited thereto, and three or more sub-inlet portions may be included in each inlet portion group so that voltage may be applied several times to a plurality of regions of a wiring unit, respectively.

Accordingly, a flat panel display apparatus and a method of manufacturing the same according to the present invention are capable of easily improving encapsulating characteristics of the flat panel display apparatus.

While this invention has been particularly shown and described with reference to exemplary embodiments thereof, it will be understood by those of ordinary skill in the art that various changes in form and detail may be made therein without departing from the spirit and scope of the invention as defined by the appended claims.

What is claimed is:

1. A flat panel display apparatus, comprising:
    a substrate;
    a display unit disposed on the substrate;
    a sealing substrate disposed so as to face the display unit;
    a sealing member disposed between the substrate and the sealing substrate so as to surround the display unit;
    a wiring unit disposed between the substrate and the sealing substrate so as to partially overlap the sealing member; and
    at least three inlet portion groups to which voltage is applied via an external power source, said at least three inlet portion groups being connected to the wiring unit;
    wherein each of said at least three inlet portion groups comprises a plurality of sub-inlet portions.

2. The apparatus of claim 1, wherein the sub-inlet portions of each of said at least three inlet portion groups are disposed apart from one another.

3. The apparatus of claim 1, wherein each of said at least three inlet portion groups comprises two sub-inlet portions disposed apart from each other.

4. The apparatus of claim 1, wherein widths of the plurality of sub-inlet portions are each greater than a width of the wiring unit.

5. The apparatus of claim 1, wherein said at least three inlet portion groups each comprise a first inlet portion group, a second inlet portion group, and a third inlet portion group which are sequentially disposed apart from one another; and
    wherein each of the first inlet portion group, the second inlet portion group, and the third inlet portion group comprises two sub-inlet portions disposed apart from each other.

6. The apparatus of claim 1, wherein said at least three inlet portion groups each comprise a first inlet portion group, a second inlet portion group, a third inlet portion group, and a fourth inlet portion group which are sequentially disposed apart from one another; and
    wherein each of the first inlet portion group, the second inlet portion group, the third inlet portion group, and the fourth inlet portion group comprises two sub-inlet portions disposed apart from each other.

7. The apparatus of claim 1, wherein said at least three inlet portion groups each comprise a first inlet portion group, a second inlet portion group, a third inlet portion group, a fourth inlet portion group, a fifth inlet portion group, and a sixth inlet portion group; and
    wherein each of the first inlet portion group, the second inlet portion group, the third inlet portion group, the fourth inlet portion group, the fifth inlet portion group, and the sixth inlet portion group comprises two sub-inlet portions disposed apart from each other.

8. The apparatus of claim 1, wherein the wiring unit comprises a plurality of wiring members.

9. The apparatus of claim 8, wherein the wiring members are disposed apart from one another on at least one of regions of the sealing member which overlap the wiring unit.

10. The apparatus of claim 8, wherein the wiring members are disposed on the substrate; and
    wherein the sealing member is disposed on the wiring members and in regions where adjacent wiring members are disposed apart from one another.

11. The apparatus of claim 1, wherein the sealing member comprises frit.

12. The apparatus of claim 1, wherein the display unit comprises one of an organic light-emitting device and a liquid crystal display device.

13. A method of manufacturing a flat panel display apparatus, the method comprising the steps of:
    preparing a substrate on which a display unit is disposed;
    disposing a sealing substrate so as to face the display unit;
    forming a sealing member between the substrate and the sealing substrate so as to surround the display unit;

forming a wiring unit between the substrate and the sealing substrate, the wiring unit having a region which overlaps the sealing member; and forming at least three inlet portion groups electrically connected to an external power source;

wherein each of said at least three inlet portion groups comprises a plurality of sub-inlet portions connected to the wiring unit; and wherein the step of forming the sealing member comprises:
preparing a material of the sealing member between the substrate and the sealing substrate; and
sequentially selecting every two adjacent inlet portion groups from among said at least three inlet portion groups, and sequentially applying voltage to the wiring unit by connecting the selected two adjacent inlet portion groups to the external power source, so that the material of the sealing member is fused and hardened by heat generated in the wiring unit by the voltage applied via the selected two adjacent inlet portion groups.

14. The method of claim 13, wherein the selected two adjacent inlet portion groups comprise a first inlet portion group and a second inlet portion group; and
wherein the voltage is applied to the wiring unit by connecting one of the sub-inlet portions, except for a sub-inlet portion closest to the second inlet portion, from among sub-inlet portions of the first inlet portion group, and one of the sub-inlet portions, except for a sub-inlet portion closest to the first inlet portion, from among sub-inlet portions of the second inlet portion group, to the external power source.

15. The method of claim 13, wherein said at least three inlet portion groups comprise a first inlet portion group, a second inlet portion group, and a third inlet portion group which are sequentially disposed apart from one another;
wherein the first inlet portion group comprises a first sub-inlet portion A adjacent to the third inlet portion group, and a first sub-inlet portion B disposed apart from the first sub-inlet portion A and adjacent to the second inlet portion group;
wherein the second inlet portion group comprises a second sub-inlet portion A adjacent to the first inlet portion group, and a second sub-inlet portion B disposed apart from the second sub-inlet portion A and adjacent to the third inlet portion group; and
wherein the third inlet portion group comprises a third sub-inlet portion A adjacent to the second inlet portion group, and a third sub-inlet portion B disposed apart from the third sub-inlet portion A and adjacent to the first inlet portion group; and
wherein the step of forming the sealing member comprises:
applying voltage to the wiring unit by connecting the first sub-inlet portion A and the second sub-inlet portion B to the external power source;
applying voltage to the wiring unit by connecting the second sub-inlet portion A and the third sub-inlet portion B to the external power source; and
applying voltage to the wiring unit by connecting the third sub-inlet portion A and the first sub-inlet portion B to the external power source.

16. The method of claim 13, wherein said at least three inlet portion groups comprise a first inlet portion group, a second inlet portion group, a third inlet portion group, and a fourth inlet portion group which are sequentially disposed apart from one another;
wherein the first inlet portion group comprises a first sub-inlet portion A adjacent to the fourth inlet portion group, and a first sub-inlet portion B disposed apart from the first sub-inlet portion A and adjacent to the second inlet portion group;
wherein the second inlet portion group comprises a second sub-inlet portion A adjacent to the first inlet portion group, and a second sub-inlet portion B disposed apart from the second sub-inlet portion A and adjacent to the third inlet portion group;
wherein the third inlet portion group comprises a third sub-inlet portion A adjacent to the second inlet portion group, and a third sub-inlet portion B disposed apart from the third sub-inlet portion A and adjacent to the fourth inlet portion group; and
wherein the fourth inlet portion group comprises a fourth sub-inlet portion A adjacent to the third inlet portion group, and a fourth sub-inlet portion B disposed apart from the fourth sub-inlet portion A and adjacent to the first inlet portion group; and
wherein the step of forming the sealing member comprises:
applying voltage to the wiring unit by connecting the first sub-inlet portion A and the second sub-inlet portion B to the external power source;
applying voltage to the wiring unit by connecting the second sub-inlet portion A and the third sub-inlet portion B to the external power source;
applying voltage to the wiring unit by connecting the third sub-inlet portion A and the fourth sub-inlet portion B to the external power source; and
applying voltage to the wiring unit by connecting the fourth sub-inlet portion A and the first sub-inlet portion B to the external power source.

17. The method of claim 13, wherein said at least three inlet portion groups comprise a first inlet portion group, a second inlet portion group, a third inlet portion group, a fourth inlet portion group, a fifth inlet portion group, and a sixth inlet portion group which are sequentially disposed apart from one another,
wherein the first inlet portion group comprises a first sub-inlet portion A adjacent to the sixth inlet portion group, and a first sub-inlet portion B disposed apart from the first sub-inlet portion A and adjacent to the second inlet portion group;
wherein the second inlet portion group comprises a second sub-inlet portion A adjacent to the first inlet portion group, and a second sub-inlet portion B disposed apart from the second sub-inlet portion A and adjacent to the third inlet portion group;
wherein the third inlet portion group comprises a third sub-inlet portion A adjacent to the second inlet portion group, and a third sub-inlet portion B disposed apart from the third sub-inlet portion A and adjacent to the fourth inlet portion group;
wherein the fourth inlet portion group comprises a fourth sub-inlet portion A adjacent to the third inlet portion group, and a fourth sub-inlet portion B disposed apart from the fourth sub-inlet portion A and adjacent to the fifth inlet portion group;
wherein the fifth inlet portion group comprises a fifth sub-inlet portion A adjacent to the fourth inlet portion group, and a fifth sub-inlet portion B disposed apart from the fifth sub-inlet portion A and adjacent to the sixth inlet portion group; and
wherein the sixth inlet portion group comprises a sixth sub-inlet portion A adjacent to the fifth inlet portion group, and a sixth sub-inlet portion B disposed apart from the sixth sub-inlet portion A and adjacent to the first inlet portion group; and wherein the step of forming the sealing member comprises:
applying voltage to the wiring unit by connecting the first sub-inlet portion A and the second sub-inlet portion B to the external power source;
applying voltage to the wiring unit by connecting the second sub-inlet portion A and the third sub-inlet portion B to the external power source;
applying voltage to the wiring unit by connecting the third sub-inlet portion A and the fourth sub-inlet portion B to the external power source;
applying voltage to the wiring unit by connecting the fourth sub-inlet portion A and the fifth sub-inlet portion B to the external power source;
applying voltage to the wiring unit by connecting the fifth sub-inlet portion A and the sixth sub-inlet portion B to the external power source; and
applying voltage to the wiring unit by connecting the sixth sub-inlet portion A and the first sub-inlet portion B to the external power source.

18. The method of claim 13, wherein the wiring unit comprises a plurality of wiring members disposed apart from one another on at least one of a plurality of parts of the sealing member which overlap the wiring unit.

19. The method of claim 18, wherein the plurality of wiring members are disposed on the substrate; and
wherein the sealing member is disposed on the plurality of wiring members, and in regions where adjacent wiring members are disposed apart from one another.

20. The method of claim 13, wherein the sealing member comprises frit.

* * * * *